United States Patent [19]
Williams

[11] 4,398,262
[45] Aug. 9, 1983

[54] TIME MULTIPLEXED N-ORDERED DIGITAL FILTER

[75] Inventor: Tim A. Williams, Austin, Tex.

[73] Assignee: Motorola, Inc., Schaumburg, Ill.

[21] Appl. No.: 333,538

[22] Filed: Dec. 22, 1981

[51] Int. Cl.³ ............................................ G06F 15/31
[52] U.S. Cl. ................................ 364/724; 179/1 SA; 179/1 SM
[58] Field of Search ........... 364/724; 179/1 SA, 1 SM

[56] References Cited

U.S. PATENT DOCUMENTS

| | | | |
|---|---|---|---|
| 3,662,115 | 5/1972 | Salto et al. | 179/1 SM |
| 4,209,844 | 6/1980 | Brantingham et al. | 364/724 |
| 4,340,781 | 7/1982 | Ichikawa et al. | 179/1 SA |
| 4,344,148 | 8/1982 | Brantingham et al. | 364/724 |
| 4,352,162 | 9/1982 | Nyuji et al. | 364/724 |

*Primary Examiner*—David H. Malzahn
*Attorney, Agent, or Firm*—Anthony J. Sarli, Jr.; Jeffrey Van Myers; Robert L. King

[57] ABSTRACT

An n-ordered digital filter is disclosed in the form of a Partial Autocorrelation (PARCOR) lattice structure having two multipliers and two adders. Time multiplexing eliminates the use of individual multipliers and adders for each order of the filter. Speech synthesis of a time varying digital input signal is provided by performing n stages of Linear Predictive Coding (LPC) difference equation operation, where n is an integer. Delay means and storage registers minimize the control circuitry and circuit die size to calculate the difference equations to an nth order.

7 Claims, 4 Drawing Figures

TIME MULTIPLEXED N-ORDERED DIGITAL FILTER

TECHNICAL FIELD

This invention relates generally to digital filters and, more particularly, to a time multiplexed n-ordered digital filter, where n is an integer.

BACKGROUND ART

Digital filters have varied applications, one of which is for speech synthesis. Speech synthesizers sometimes use a partial autocorrelation (PARCOR) lattice filter structure to model the human vocal tract. One well known PARCOR lattice structure utilizes multiple stages, each stage comprising two multipliers and two adders as shown in U.S. Pat. No. 3,662,115 entitled "Audio Response Apparatus Using Partial Autocorrelation Techniques". PARCOR coefficients can be related to boundary value equations for the transmitted and reflected sound pressure wave in an acoustic tube model of the vocal tract. A sound pressure wave in this acoustic tube model comprises a transmitted wave and a plurality of reflected waves, the sum of which produces a plurality of impulses, each of which is separated by an exponential amplitude decay. These impulses are generated by the vocal cords of a human. The vocal cords function similar to a relaxation oscillator by bursting open and passing an impulse of air from the lungs into the vocal tract. When the pressure on both sides of the vocal cords is equalized, the force of the neck muscles cause the vocal cords to close. This action of the vocal cords produces a type of speech sound termed voiced. An example of voiced speech would be any vowel. Another type of speech sound is termed unvoiced. The 's' sound in 'hiss' is an example of unvoiced speech. PARCOR lattice structures having a minimum of four stages for unvoiced speech and eight stages for voiced speech are generally required for quality synthesis.

Typical disadvantages with digital filters using the two multiplier PARCOR lattice filter structure include problems with either hardware complexity, control complexity, calculation speed, coefficient and interstage precision or circuit die size, or any combination of the above. For example, some digital filters which implement a PARCOR lattice structure have aperiodic control signals which are complex to implement. Other implementations have used either fully parallel or pipelined conventional multipliers which are inefficient in both power and size although speed efficient. Previously, when any one of the above problems has been overcome, the performance of the PARCOR lattice structure decreases with respect to at least one of the other problems. For example, although time multiplexing of PARCOR lattice filter structures has been suggested in the prior art, the previously mentioned problems still exist.

BRIEF SUMMARY OF THE INVENTION

Accordingly, an object of the present invention is to provide an improved n-ordered digital filter, where n is an integer.

Another object of the present invention is to provide an improved time multiplexed n-ordered digital filter, where n is an integer.

Another object of the present invention is to provide an improved PARCOR lattice structure filter which utilizes PARCOR coefficients of optimum bit width, optimum clock rates, and which is die size sufficient.

Yet another object of the present invention is to provide an improved time multiplexed n-ordered PARCOR lattice structure filter, where n is an integer.

In carrying out the above and other objects and advantages of the present invention, there is provided, in one form, a digital filter having a predetermined number of n time multiplexed stages comprising only two multipliers and two adders. One of the many embodiments of the digital filter is a PARCOR lattice structure for speech synthesis. A sampled input speech signal is selectively coupled to the filter. A plurality of n storage registers selectively provides the signals necessary to perform calculations of boundary value equations which are based on the acoustic tube model of the vocal tract. Appropriate amounts of delay minimize the control circuitry required to provide the various signals needed to perform the boundary value equations.

The above and other objects, features and advantages of the present invention will be more clearly understood from the following detailed description taken in conjunction with the accompanying drawings.

DETAILED DESCRIPTION OF THE PREFERRED EMBODIMENT

Figure 1:
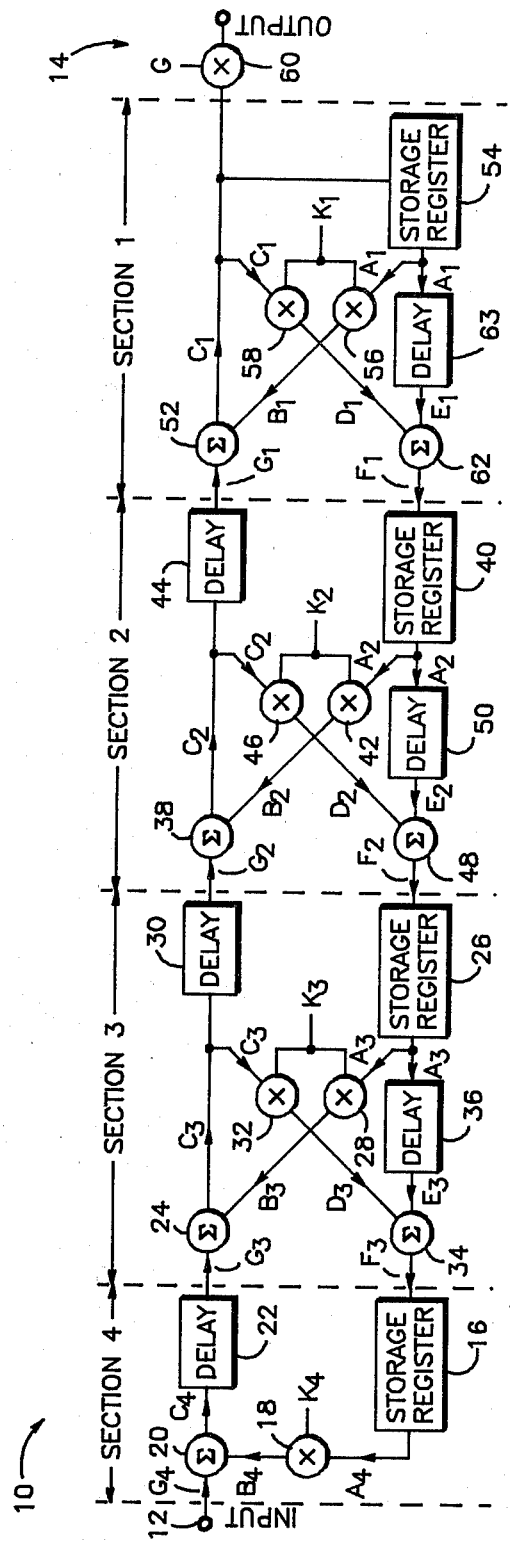
FIG. 1 illustrates in signal flow form a digital filter known in the prior art.

Shown in FIG. 1 is an n ordered digital filter 10 using a PARCOR lattice structure having an input 12, an output gain stage 14 and four sections whereby n equals four. Filter 10 implements the Linear Predictive Coding (LPC) difference equations which are mathematical expressions of the boundary value equations for speech. The LPC equations implemented by each section of filter 10 are:

$$C_n(t) = G_n(t) - B_n(t)$$

and $$F_n(t) = E_n(t) + D_n(t)$$

where, $$B_n(t) = K_n A_n(t)$$

$$D_n(t) = K_n C_n(t)$$

and $$A_n(t) = F_{n-1}(t-1).$$

Signal $G_4$ is a sample of a time varying input speech signal in digital form. Signals $D_n(t)$ and $B_n(t)$ represent ordered reflection signals which are present in the form of a reflected wave in an acoustic tube model of the vocal tract. Signal $C_n(t)$ represents the transmitted output signal or wave of each stage or acoustic tube, after the reflection signal of each previous stage has been subtracted therefrom. Signal $D_n(t)$ represents a harmonic component of the reflection signal. All of the adders described herein may easily perform subtractions by changing a sign bit of an input signal.

The highest ordered or fourth section comprises a storage register 16 which has an output coupled to a first input of a multiplier 18 and which provides a reflection signal A4. Coupled to a second input of multiplier 18 is a PARCOR reflection coefficient K4. An output of multiplier 18 provides a reflection signal B4 which is coupled to a first input of an adder 20. A second input of adder 20 is coupled to a sample of input signal G4 and adder 20 provides a signal C4 as an output. Signal C4 is coupled to the third section via delay means 22 which provides a signal G3 to a first input of an adder 24. Signal G3 is signal C4 delayed by a predetermined number of cycles.

The third section comprises a storage register 26, for providing a reflection signal A3 to a first input of a multiplier 28. A second input of multiplier 28 is coupled to a PARCOR reflection coefficient K3. An output of multiplier 28 provides a reflection signal B3 which is coupled to a second input of adder 24. Adder 24 has an output which provides a signal C3 which is coupled to both a delay means 30 and a first input of a multiplier 32. A second input of multiplier 32 is coupled to PARCOR reflection coefficient K3. Multiplier 32 has an output for providing a signal D3 which is coupled to a first input of an adder 34. Signal A3 is also coupled from the output of storage register 26 to a delay means 36 which provides a signal E3 to a second input of adder 34. Signal E3 is identical to A3, only delayed in time. Adder 34 provides a signal F3 as an output which is coupled to an input of storage register 16 of the fourth timing section. Signal C3 is coupled to the second section via delay means 30, for providing a signal G2, which is actually the C3 signal delayed, to a first input of an adder 38.

The second section comprises a storage register 40 for providing a signal A2 to a first input of a multiplier 42. A second input of multiplier 42 is coupled to a PARCOR reflection coefficient K2. An output of multiplier 42 provides a signal B2 which is coupled to a second input of adder 38. Adder 38 has an output, for providing a signal C2 which is coupled to both a delay means 44 and a first input of a multiplier 46. A second input of multiplier 46 is coupled to the PARCOR reflection coefficient K2. Multiplier 46 has an output for providing a signal D2 which is coupled to a first input of an adder 48. Signal A2 is also coupled from the output of storage register 40 to a delay means 50 which provides a signal E2 to a second input of adder 48. Signal E2 is identical to A2, only delayed in time. Adder 48 provides a signal F2 at an output which is coupled to an input of storage register 26 of the third section. Signal C2 is coupled to the first section via delay means 44, for providing a signal G1 which is signal C2 delayed, to a first input of an adder 52.

The first section comprises a storage register 54 for providing a signal A1, to a first input of a multiplier 56. A second input of multiplier 56 is coupled to a PARCOR reflection coefficient K1. An output of multiplier 56 provides a signal B1 to a second input of adder 52. Adder 52 has an output, for providing a signal C1 which is coupled to an input of both a multiplier 58, a multiplier 60 and to storage register 54. A second input of multiplier 58 is coupled to PARCOR reflection coefficient K1. Multiplier 58 has an output for providing a signal D1 which is coupled to a first input of an adder 62. Signal A1 is also coupled from the output of storage register 54 to a delay means 63 which provides a signal E1 to a second input of adder 62. Signal E1 is identical to A1, only delayed in time. Adder 62 provides a signal F1 as an output which is coupled to an input of storage register 40 of the second section.

The output gain stage 14 is comprised of multiplier 60 which has a second input coupled to a gain amplification signal G. The output of filter 10 is provided at an output of multiplier 60 and represents one filtered sample of the input signal.

Figure 3:
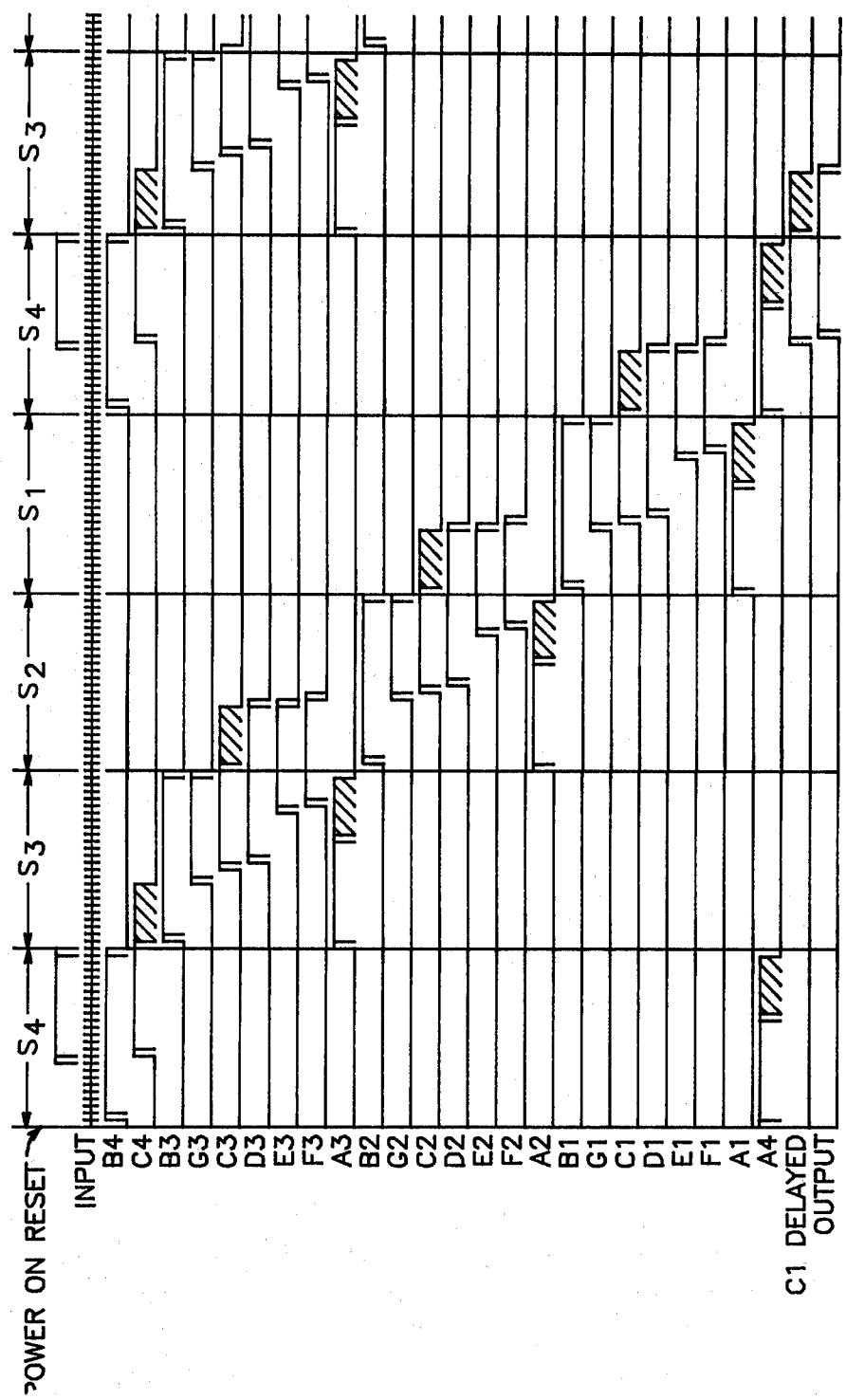
FIG. 3 illustrates in graphical form a timing diagram for various signals of the filters of FIGS. 1 and 2.

Shown in FIG. 3 is a timing diagram of the digital signals generated by the circuit of FIG. 1. FIG. 3 indicates only the presence or absence of a particular signal at a particular time and not the logic level of that signal. Since filter 10 is a fourth order or a four stage PARCOR lattice structure, there are four distinct timing sections S4, S3, S2, and S1 corresponding to signals generated by the four respective sections. The number of stages, n, could be expanded to implement any order of filter desired by adding duplicates of section 2 or 3.

Generally, several factors determine the time required to perform the boundary value equation calculation in each stage when serial arithmetic units are used. The number of cycles per section is primarily determined by the bit length of both the PARCOR coefficients and the data. The timing can easily be adapted for different precisions of data. The fastest speed possible for performing the calculations required in a single section is determined by the precision of the multipliers used, plus a reset pulse. For purposes of illustration only, assume that the precision of the PARCOR reflection coefficients is 8 bits and that the precision of the interstage data is 16 bits. The first bit shown in FIG. 3 for each signal is the least significant bit and the last bit is the sign bit of a two's complement notation. A 1 cycle reset pulse is needed to reset the adders and multipliers once each timing section. Therefore, each timing section is 25 cycles long (8+16+1) and a ten stage lattice structure would require 250 cycles.

In operation, some general assumptions regarding the multipliers and adders can be made. Every change of state occurs on a rising clock edge. The multiplication operations are performed serially in a conventional manner and all the adders described are conventional serial adders which use stored carry techniques. All of the multipliers described provide 24 bit products which are truncated to 16 bits. The PARCOR coefficients can be presented either serially or in parallel. However, the timing is not affected by the form of the PARCOR coefficients. Although the circuit of FIG. 1 will perform the boundary value equations, the circuit has serious disadvantages for most applications. Some of the disadvantages include circuit die size which is too large and control circuitry which is too complex.

Figure 2:
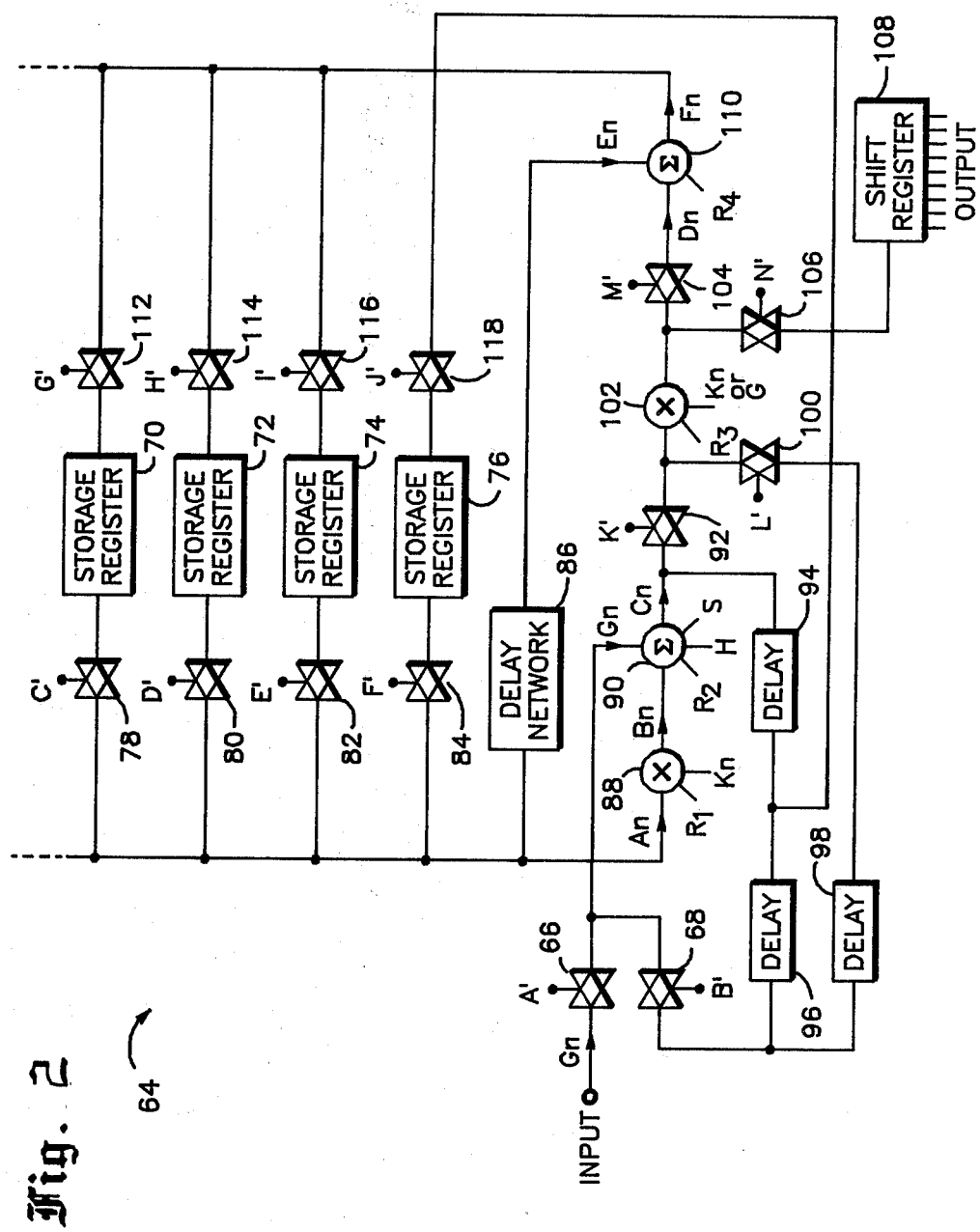
FIG. 2 illustrates in schematic form a digital filter constructed in accordance with the preferred embodiment of the present invention.
Figure 4:
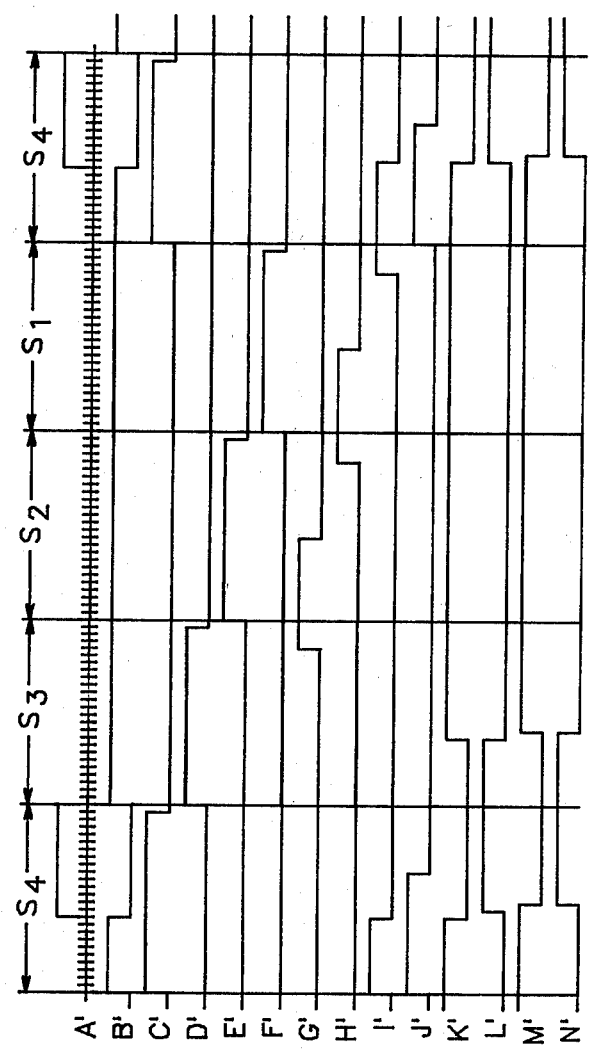
FIG. 4 illustrates in graphical form a timing diagram for controlling the filter of FIG. 2.

Shown in FIG. 2 is an n ordered digital filter 64 constructed in accordance with the preferred embodiment of the invention. For purposes of illustration only, n is chosen to be four. A sample of time varying input signal $G_n$ is coupled to a first terminal of a switch 66 which is clocked by a signal A' shown in FIG. 4. A terminal of a switch 68 is coupled to a second terminal of switch 66. Switch 68 is clocked by a signal B'. A plurality of n, or four, storage registers 70, 72, 74 and 76 each have a respective output coupled to a corresponding first terminal of a plurality of n switches 78, 80, 82 and 84. Switches 78, 80, 82 and 84 each have a respective second terminal coupled together and to both an input of a delay network 86 and a first input of a multiplier 88. A second input of multiplier 88 is coupled to a predetermined reflection coefficient $K_n$. A reset signal R1 is coupled to multiplier 88 to selectively reset multiplier 88. The second terminal of switch 66 and the first terminal of switch 68 are coupled to a first input of an adder 90. A second input of adder 90 is coupled to the output of multiplier 88. A reset signal R2, a sign signal S for determining whether an addition or a subtraction of the inputs is to be performed, and a hold signal H for extending the sign of one input are coupled to adder 90 which has an output coupled to both a first terminal of a switch 92 and an input of a delay network 94. Switch 92 is clocked by a signal K'. Delay network 94 has an output coupled to an input of a delay network 96 which has an output coupled to both an input of a delay network 98 and another terminal of switching means 68. An output of delay network 98 is coupled to a first terminal of a switch 100 which is clocked by a signal L'. A second terminal of switch 100 is coupled to both a second terminal of switch 92 and a first input of a multiplier 102. A second input of multiplier 102 is coupled to either a predetermined one of the n PARCOR reflection coefficients $K_n$ or a gain signal G. A reset signal R3 is also coupled to multiplier 102. An output of multiplier 102 is coupled to both a first terminal of a switch 104 and a first terminal of a switch 106 which are clocked by signals M' and N', respectively. A second terminal of switch 106 is coupled to a shift register 108 which has an output for providing the output of filter 64 in a parallel form. A second terminal of switch 104 is coupled to a first input of an adder 110. An output of delay network 86 is coupled to a second input of adder 110 which also has a reset signal R4 coupled thereto. An output $F_n$ of adder 110 is coupled to each of the first terminals of a plurality of switches 112, 114 and 116 which are clocked by signals G', H', and I', respectively. Each of the switches 112, 114 and 116 has a second terminal coupled to a respective one of a plurality of inputs of storage registers 70, 72 and 74. The output of delay network 94 is also coupled to a first terminal of a switch 118 which is clocked by a signal J'. A second terminal of switch 118 is coupled to an input of storage register 76.

In operation, when filter 64 operates as a fourth ordered filter, four storage registers are required and the same four distinct segments S4, S3, S2 and S1 of FIG. 3 exist to generate an output signal. Therefore n is initially equal to four. At the beginning of operation of the first timing segment S4, a power on reset signal reinitializes all adders, multipliers, registers and delay networks. Signal A4 which is 16 bits long is coupled from storage register 70 to the first input of adder 88 during the first cycle of timing segment S4 by switch 78 which is closed by signal C' shown in FIG. 4. The first cycle of all signals shown in FIG. 3 is the least significant bit (LSB) and the last cycle is a sign bit. The additional cross-hatched portion of signals $A_n$ and $C_n$ is a sign extension which is required for two's complement arithmetic. Two's complement arithmetic is used by multipliers 88 and 102 to perform the multiplications in a conventional manner. PARCOR reflection coefficient K4, which is 8 bits long, is coupled to multiplier 88, least significant bit first, and multiplied by signal A4. Multiplier 88 causes a one cycle delay in forming a product, so product signal B4, which is 24 bits long, is present at the second input of adder 90 during the second thru twenty-fifth cycles of timing segment S4. A time varying input signal G4 is selectively coupled by signal A' to adder 90 at the beginning of the ninth cycle of timing segment S4. During the tenth cycle of timing segment S4, signal C4 which is the sum or difference of signals B4 and G4, depending upon the S control input, is provided at the output of adder 90. Signal C4 is coupled directly into delay network 94 which holds C4 for 15 cycles before coupling C4 into delay network 96. The reason for initially delaying signal C4 or $C_n$ for 15 cycles is that once signal C1 is calculated, signal C1 will be loaded into storage register 76. However, at the time the LSB of signal C1 becomes valid, signal A1 is still being read out of storage register 76. Since it is impossible to store C1 in storage register 76 while maintaining the sign extension requirements of A1, the LSB of signal C1 is coupled to the input of storage register 76 via delay network 94 at the beginning of timing segment S4. Delay networks 94 and 96 then hold signal $C_n$ (initially C4) for 24 cycles. In order to provide the proper timing for signal $G_{(n-1)}$, signal $C_n$ is delayed from the output of adder 90 to the first input of adder 90 by one cycle less than the number of cycles per section. In this example, the delay therefore should be twenty-four cycles. Signal C4 is then coupled into the first input of adder 90 via switch 68 as signal G3 beginning with the ninth cycle of timing segment S3. Delay networks 86, 94, 96 and 98 are conventional circuits and are of the same type as the delay networks of FIG. 1.

Prior to providing signal G3 at the ninth cycle of timing segment S3, signal B3 which is 24 bits long is provided to the second input of adder 90 from the second to twenty-fifth cycles of timing segment S3. Signals G3 and B3 are added to provide signal C3 at the start of the tenth cycle of timing segment S3. Delay network 86 holds signal A3 from storage register 72 for 19 cycles and couples A3 to the second input of adder 110 as signal E3 from the 19the cycle of timing segment S3 until the 10th cycle of timing segment S2. The amount of delay in delay network 86 represents the amount of delay from An to Dn, or 3 cycles, plus two times the number of bits truncated by multipliers 88 and 102, eight. Therefore, in the example shown the delay should be 3+(2)(8), or 19 cycles. Signal C3 is coupled to multiplier 102 at the tenth cycle of timing segment S3 via switch 92. Signal D3 is formed beginning with the eleventh cycle of timing segment S3 and is coupled to adder 110 via switch 104. Signal F3 which is 16 bits long is provided beginning with the twentieth cycle of S3. Signal F3 is coupled to storage register 70 via switch 112 where F3 is stored for use as a new signal A4 in the filtering of a new sample of the input signal.

During timing segments S2 and S1, signals B2, B1, G2, G1, C2, C1, D2, D1, E2, E1, F2 and F1 are provided as shown in FIG. 3. Signal F2 is coupled to storage register 72 and signal F1 is coupled to storage register 74. When C1 is formed at the tenth cycle of timing segment S1, after a 15 cycle delay, C1 is coupled to storage register 76 to become signal A1 for filtering a new sample of the input signal.

When signal C1 is formed during timing segment S1, the output signal of the LPC equations has been formed. However, this signal is usually amplified and converted from digital to analog form where it may be coupled to a speaker for sound reproduction. Since a calculation of signal D4 is unnecessary, the amplification can be done in the time normally used by a $D_n$ calculation. Therefore, signal C1 is coupled to the first input of multiplier 102 via delay networks 94, 96 and 98 which provide a total delay of 25 cycles or 1 segment. The delay in delay network 98 is 1 cycle since the delays of networks 94 and 96 were 15 and 9 cycles, respectively.

Signal C1 is intentionally delayed one segment so that C1 is valid at the first input of multiplier 102 at the same time that signal C4 would have been available to perform a signal D4 calculation. A gain coefficient G is coupled to multiplier 102 at the same time PARCOR coefficient K4 would have been coupled. Switch 106 couples the output signal in serial form to shift register 108 which provides the output signal in parallel form.

A new cycle begins with the start of every timing segment S4 and repeats as described above. Reset signals R1, R2, R3 and R4 (not shown) are provided during each timing segment. Reset signal R1 is present during the first cycle of every timing segment. Reset signal R2 is present during the tenth cycle of every timing segment. Reset signal R3 is present during the eleventh cycle of every timing segment. Reset signal R4 is present during the twentieth cycle of every timing segment. Signal H keeps the previous sign bit of signal $C_n$ active for sign extension purposes. The control signals of FIG. 4 may be readily derived from standard control logic (not shown).

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A time multiplexed n-ordered digital filter, where n is an integer, comprising:

storage means for selectively storing and providing, in response to the actuation thereof, a plurality of n rank ordered storage signals;

first multiplier means having a first input coupled to said storage means, a second input coupled to a predetermined one of n rank ordered coefficient signals related to a mathematical expression of said digital filter, and an output for providing, in response to the actuation thereof, one of n rank ordered first signals representing the product of a corresponding one of n rank ordered stored signals and a corresponding one of n rank ordered coefficient signals;

first adder means having a first input coupled to the output of said first multiplier means, a second input coupled to a selected one of either an input signal or the next lower ranked one of said second signals, and an output for providing, in response to the actuation thereof, one of n rank ordered second signals representing the sum of the corresponding one of said first signals and a selected one of either an input signal or the next lower ranked one of said second signals;

second multiplier means having a first input coupled to the output of said first adder means, a second input coupled to a predetermined one of said coefficient signals, and an output for providing, in response to the actuation thereof, one of n rank ordered third signals representing the product of the corresponding one of said second signals and the corresponding one of said coefficient signals; and second adder means having a first input coupled to the output of said second multiplier means, a second input coupled to said storage means, and an output coupled to said storage means for providing, in response to the actuation thereof, one of n rank ordered fourth signals representing the sum of the corresponding one of said third signals and the corresponding one of said stored signals.

2. The time multiplexed n-ordered digital filter of claim 1, further comprising:

control means coupled to said first multiplier means, said first adder means, said second multiplier means, said second adder means and said storage means for selectively actuating said first multiplier means, said first adder means, said second multiplier means, said second adder means and said storage means to perform a predetermined digital filter function.

3. The time multiplexed n-ordered digital filter of claim 1 further comprising:

first delay means having an output, and an input coupled to an output of said first adder means, for selectively holding one of said n rank ordered second signals; and second delay means having an input coupled to the output of said first delay means, and an output coupled to said first adder means, for selectively holding and providing the selected one of the next lower ranked second signals.

4. The time multiplexed n-ordered digital filter of claim 3 wherein said storage means further comprise:

a rank ordered plurality of n storage registers, with each storage register except a lowest ranked storage register having a respective input selectively coupled to an output of said second adder means, the lowest ranked storage register having an input selectively coupled to the output of said first delay means, and all of the storage registers having a respective output selectively coupled to both said first multiplier means and to said second adder means.

5. The time multiplexed n-ordered digital filter of claim 4 comprising:

third delay means having an input selectively coupled to each output of said storage registers, and an output coupled to said second adder means, for selectively holding and providing the corresponding one of said stored signals.

6. The time multiplexed n-ordered digital filter of claim 5 further comprising:

fourth delay means having an input coupled to the output of said second delay means, and an output selectively coupled to said second multiplier means, for selectively delaying the filtered output signal;

switching means having an input coupled to the output of said second multiplier means, and an output; and second storage means coupled to the output of said switching means, for storing said filtered output signal and converting the form thereof from serial to parallel.

7. A method of using a time multiplexed n-ordered digital filter to filter a time varying input signal, said filter having first and second multiplier means, first and second adder means, and storage means for selectively storing and providing a plurality of n rank ordered storage signals, where n is an integer, comprising the steps of:

(a) actuating said storage means to provide the stored signal of highest rank to said first multiplier means;

(b) providing a rank ordered coefficient signal of highest rank to said first multiplier means, said coefficient signal being related to a mathematical expression of said digital filter;

(c) actuating said first multiplier means to provide a highest ranked of n rank ordered first signals to said first adder means, each of said rank ordered first signals representing the product of said storage signal of corresponding rank and said coefficient signal of corresponding rank;

(d) providing a sample of said input signal to said first adder means;

(e) actuating said first adder means to provide a highest ranked of n rank ordered second signals, each of said rank ordered second signals representing the sum of said first signal of corresponding rank and a selected one of either an input signal or the next lower ranked one of said second signals;

(f) providing said second signal of highest rank to said first adder means;

(g) actuating said storage means to provide the stored signal or next lower rank to said first multiplier means;

(h) providing the coefficient signal of said next lower rank to said first multiplier means;

(i) actuating said first multiplier means to provide the first signal of said next lower rank to the first adder means;

(j) actuating said first adder means to provide the second signal of said next lower rank to said second multiplier means;

(k) providing the second signal of said next lower rank to the first adder means;

(l) providing the coefficient signal of said next lower rank to said second multiplier means;

(m) actuating said second multiplier means to provide a predetermined one of n rank ordered third signals of next lower rank to said second adder means, each of said rank ordered third signals representing the product of said second signal of corresponding rank and said coefficient signal of corresponding rank;

(n) actuating said storage means to provide the stored signal chosen in step (g) to said second adder means;

(o) actuating said second adder means to provide a predetermined one of n rank ordered fourth signals of next lower rank to the storage means, each of said rank ordered fourth signals representing the sum of said third signal of corresponding rank and said stored signal of corresponding rank;

(p) actuating said storage means to store said fourth signal of said next lower rank as the stored signal of next higher rank;

(q) repeating steps (g) through (p) $n-2$ times;

(r) repeating steps (g) through (j), to provide the second signal of lowest rank;

(s) actuating said storage means to store said second signal of lowest rank as the stored signal of lowest rank;

(t) actuating said second multiplier means to provide said second signal of lowest rank as a filtered output signal; and (u) repeating steps (a) through (t), for filtering successive samples of said time varying input signal.

* * * * *